United States Patent [19]

Schaepers et al.

[11] Patent Number: 4,929,802
[45] Date of Patent: May 29, 1990

[54] ELECTROMAGNETICALLY SHIELDED CABIN

[75] Inventors: Arno Schaepers, Friedrichshafen; Bernd Grabherr, Ravensburg, both of Fed. Rep. of Germany

[73] Assignee: Zeppelin-Metallwerke GmbH, Fed. Rep. of Germany

[21] Appl. No.: 284,393

[22] Filed: Dec. 14, 1988

[30] Foreign Application Priority Data

Dec. 16, 1987 [DE] Fed. Rep. of Germany ... 8716599[U]

[51] Int. Cl.$^5$ .............................................. H05K 9/00
[52] U.S. Cl. .............................. 174/35 MS; 439/524
[58] Field of Search ................... 174/35 MS; 361/424; 439/524

[56] References Cited

U.S. PATENT DOCUMENTS

| | | |
|---|---|---|
| 2,858,520 | 10/1958 | Chance, Jr. |
| 3,437,735 | 4/1969 | Schaller, Jr. .................. 174/35 MS |
| 4,069,618 | 1/1978 | Geiss .......................... 174/35 MS X |
| 4,750,569 | 6/1988 | Flogaus ........................ 174/35 MS |
| 4,786,758 | 11/1988 | Zielinski ..................... 174/35 MS X |

FOREIGN PATENT DOCUMENTS 2601277 7/1976 Fed. Rep. of Germany.
3305928 8/1984 Fed. Rep. of Germany.

Primary Examiner—Leo P. Picard
Assistant Examiner—David A. Tone
Attorney, Agent, or Firm—Bernard, Rothwell & Brown

[57] ABSTRACT

An electromagnetically shielded cabin is disclosed which utilizes a novel sealing system enabling reduced maintenance expenditures for maintaining necessary electrical contract, and thus the necessary shield attenuation values, when cabin parts are made of aluminum. The contact surfaces forming part of the novel sealing system are coated with tin which enable the reduced maintenance expenditures and achieve excellent shield attenuation values.

9 Claims, 3 Drawing Sheets

ELECTROMAGNETICALLY SHIELDED CABIN

BACKGROUND OF THE INVENTION

The invention relates to an electromagnetically shielded cabin.

To shield highly sensitive electronics means, computer systems, etc. against high-frequency electromagnetic waves or field, shield cabins are used. The cabins offer both a shielding against the irradiation or radiation of electromagnetic radio or radar waves and against electromagnetic interferences e.g. by strokes of lightning. The cabins also protect the electronic means against a destruction by a nuclear electromagnetic pulse, i.e. against the strong electromagnetic field which occurs during a nuclear explosion, in particular if they are used in the military field.

A weak point of the shielding is the abutting area between a stationary component, i.e. a stationary wall and a movable wall component such as a door, a flap, a hatch or a movable window. However these abutting areas must also achieve the necessary shield attenuation values with the wall being closed and the transfer resistances may only be in the milliohm range. Therefore it is necessary to establish a good electric contact across the abutting area.

An electromagnetically shielded cabin of the type explained above is known from DE-A 26 01 277. The cabin has a sealing system between a door frame of thick sheet metal, e.g. plated steel and a door of a steel construction. The sealing system consists of a knife contact of plated steel which is inserted between contact springs made of beryllium copper. The sealing system of the known cabin does however only achieve sufficient attenuation values with the described combination of materials according to the statements of this publication, and it is explicitly mentioned that these attenuation values can by no means be achieved when using aluminum.

In the publication of Siemens company "EMV Raumabschirmung, Kabinenteile, Filter", edition 83/84, a sealing system which can be used for the abutting area is described which is called a knife contact. Part of this sealing system consists of two contact springs disposed in a groove, the groove having a substantially rectangular cross-section. The second part is a beaded, strip-shaped contact web with an oblong, rectangular cross-section which angles off from the door frame. If the door is closed, the beaded area of the contact webs is pressed in such fashion between the contact springs that the same are slightly deformed. Due to this, each abuts against the walls of the groove and the surface of the contact web in a conductive contact. The cabin consists of a frame of sections and a sheet steel filling. The contact web consists also of steel. In order to ensure that the electric contact is not deteriorated in the course of time across the abutting area, the sealing system must be cleaned at regular intervals and protected against corrosion. This rust protection is also achieved by a thin fat film, which however, will increase in turn also the transfer resistance.

The problem of the cleaning and the upkeep of the sealing system becomes especially serious, if mobile cabins are to be built of aluminum to save weight. The aluminum forms immediately an oxide film on its surface upon contact with the air oxygen which increases the transfer resistance. To achieve acceptable shielding values, such a sealing system of aluminum would have to be cleaned daily, which is neither reasonable nor is it carried out in practical operation.

The invention is thus directed toward making an electromagnetically shielded cabin with a sealing system available, which requires little maintenance even if aluminum is used as construction material for the cabin and achieves high shield attenuation values.

The object is accomplished by providing a sealing system for an abutting area between a stationary component of the cabin and a moving wall component wherein two spaced, bent contrast springs are connected to the one component, between which a contact web connected to the other component can be passed, and contact surfaces in each case being formed between the contact web and the contact springs and between the contract springs. The electromagnetically sealed cabin of the present invention is characterized in that at least one of the contact surfaces is comprised of aluminum which is provided with a tin coating.

According to the present invention, using a tin coating achieves very good contacting between the contact surfaces being in engagement with each other. The obtainable shield atentuation values are noticeably above the relevant standard even if aluminum is used as construction material for the wall and/or the door. The shield attenuation is also not deteriorated during continuous operation, which is surely attributable to the fact that tin is a relatively soft metal so that oxide films are removed due to the relative movement between the contact surfaces, the contact surfaces are thus kept uncovered and a form-fit contact seat is properly worked out. At the same time tin only forms an extremely thin oxide layer even under a great environmental strain which does not hinder a good contacting.

So far tin has only been used for purely electrical connections, for instance for permanent connections or as a coating in clamping connections which must only rarely be loosened. The US-A-2 858 520 describes a terminal of an aluminum material which is provided with a cadmium layer above adhesion promoting layers of zinc and copper. In order to reduce the cyclically occurring heating by the cadmium layer which occurs in the case of a-c load, a thin porous film of preferably nickel, but also of tin was applied externally on the cadium layer. The cadmium layer is to be in electrical contact with the clamped wire through the pores of the porous film. However, this requires that the terminal be tightened with such a great contact pressure that the contact points interflow. The contact terminal is thus only destined for a single use. Indications that a tin coating can also be used for sealing systems of electromagnetically shielded cabins are not revealed by this publication.

The DE-A-33 05 918 shows furthermore a connector for printed circuits which is designed in the form of a knife contact. One of the two contact surfaces of the knife contact and the abutting contact surface of the contact spring are in each case coated with a noble metal such as gold or palladium, while the opposite contact surface of the knife contact and the abutting contact surface of the contact spring are coated with tin. A spring material is indicated as base material for the spring and brass is indicated for the knife contact. Coatings of noble metal are, however, much too expensive in the case of the large sealing surfaces for the sealing system of an electromagnetically shielded cabin. The tin coating and the coating with noble material are moreover connected with each other in electrically conductive fashion which may lead to contact corrosion in particular when used in the out of doors (high air humidity and rain), in which the base metal is eroded. Moreover a tin coating on both sides is considered to be detrimental in the publication.

It is a further object of the invention to improve the adhesion of the tin coating on aluminum surfaces by arranging a coupling agent between the tin coating and the aluminum surface. If zinc is used as a coupling agent, a comparatively good abrasion resistance will result.

It became apparent that the contact is still further improved if according to the contact springs are also tin-plated, even if they consist of a material other than aluminum.

To apply the tin coating the flame-spraying process is preferably used according to claim 5.

A wedge-shaped cross-section of the contact web is preferred for allowing the contact surfaces between the contact web and the contact spring to rub against each other across a greater area. Moreover, the flattening of the curvature of the bent contact spring is supported by this cross-section so that the same moves rubbingly along the contact surface of the element supporting the contact spring with its contact surface. Due to this frictional movement a better self-cleaning is achieved both between the contact web and the contact spring and between the contact spring and the element supporting it. The wedge-shaped cross-section is further advantageous in that the pressing pressure against the contact springs can be varied thereby and work tolerances can be compensated thereby. However, due to the wedge-shaped cross-section, the closing of the door, in particular in the area of the hinges, is facilitated, where the movement path of the contact web or the gap between the contact springs is strongly bent due to the greater vicinity to the fulcrum. Due to the inclination of the surfaces of the contact web, the curvatures can be compensated substantially better.

In order to protect the contact springs against damage and to facilitate a correct closing of the door, the contact springs are disposed in the groove.

An aperture angle of the wedge cross-section, in the range of 25° to 35° will largely avoid the self-inhibition of the contact web.

It is a further object of the invention to provide contact springs adapted to be simply clipped in so that they can be easily disassembled and assembled.

An example of embodiment of the invention is explained in more detail in the following by means of the drawings.

DETAILED DESCRIPTION OF THE DRAWINGS

Figure 1:
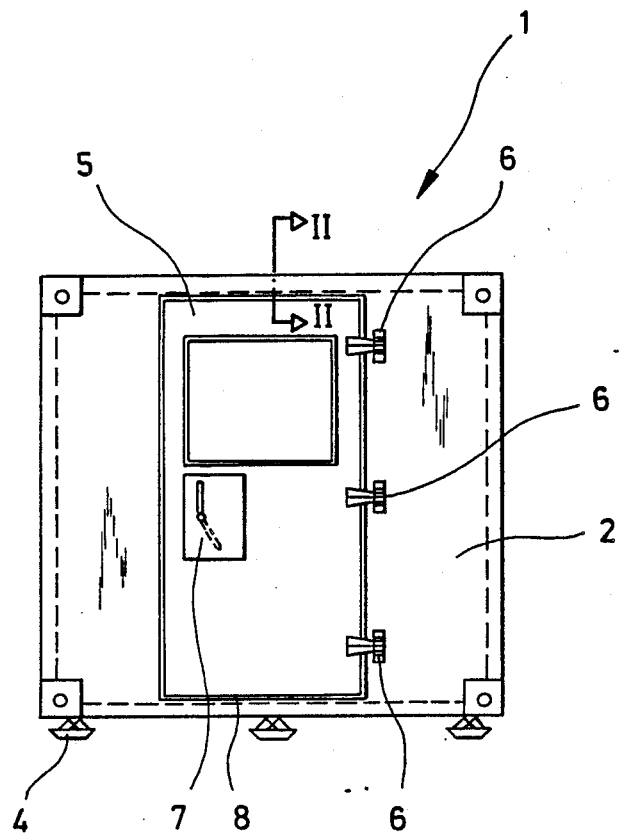
FIG. 1 shows a front view of a cabin with the sealing system according to the invention.

FIG. 1 shows a front view of a customary mobile, shielded cabin 1. The cabin 1 has a front wall in sandwich construction with cover sheets of aluminum and rests on skids 4. An aperture for a door 5 is spared in the front wall 2 which is pivotable about the hinged 6. The door 5 contains a lock 7 (spring-loaded catch, safety lock or the like).

Figure 2:
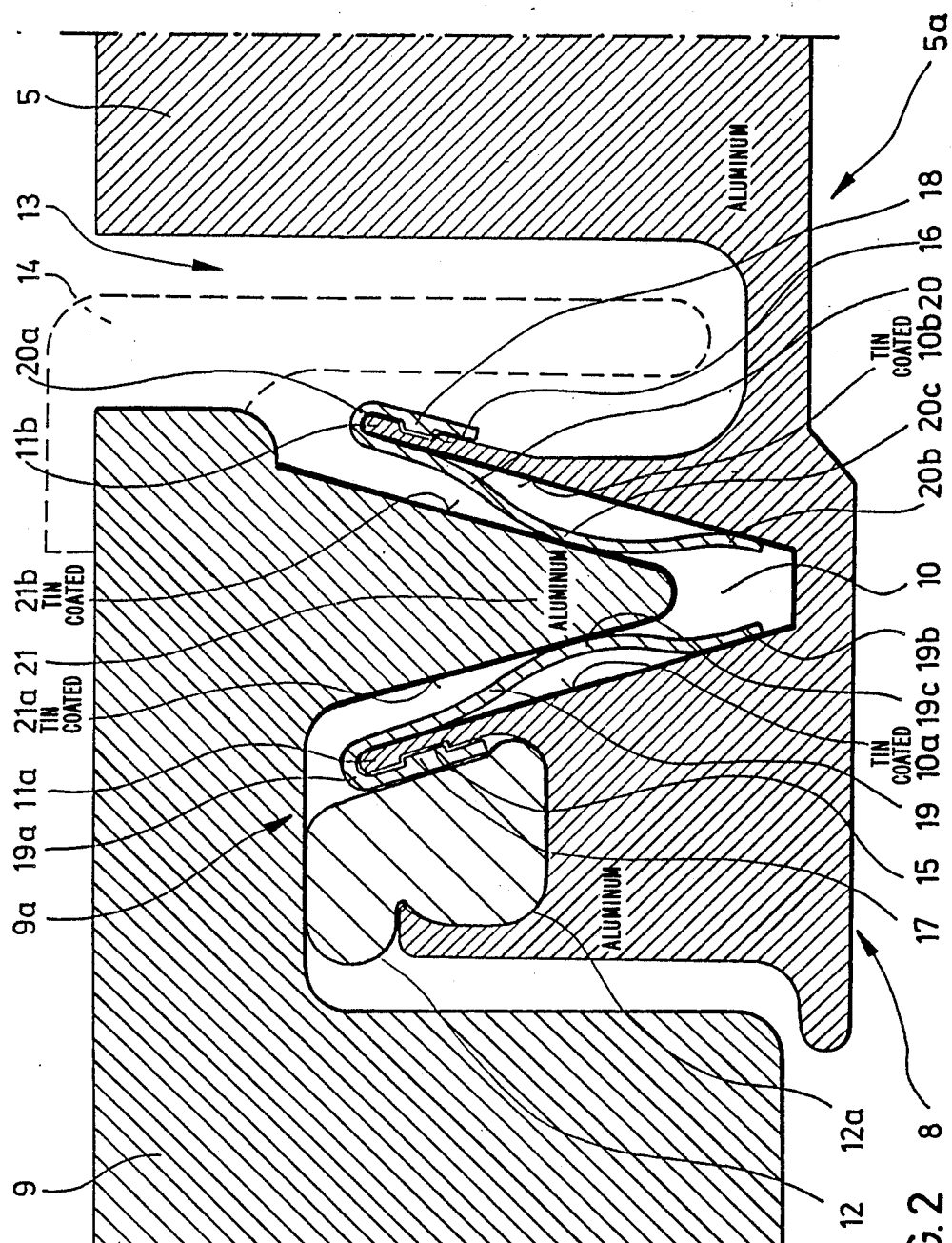
FIG. 2 shows an enlarged section through the sealing system according to the invention along II—II of FIG. 1
Figure 3:
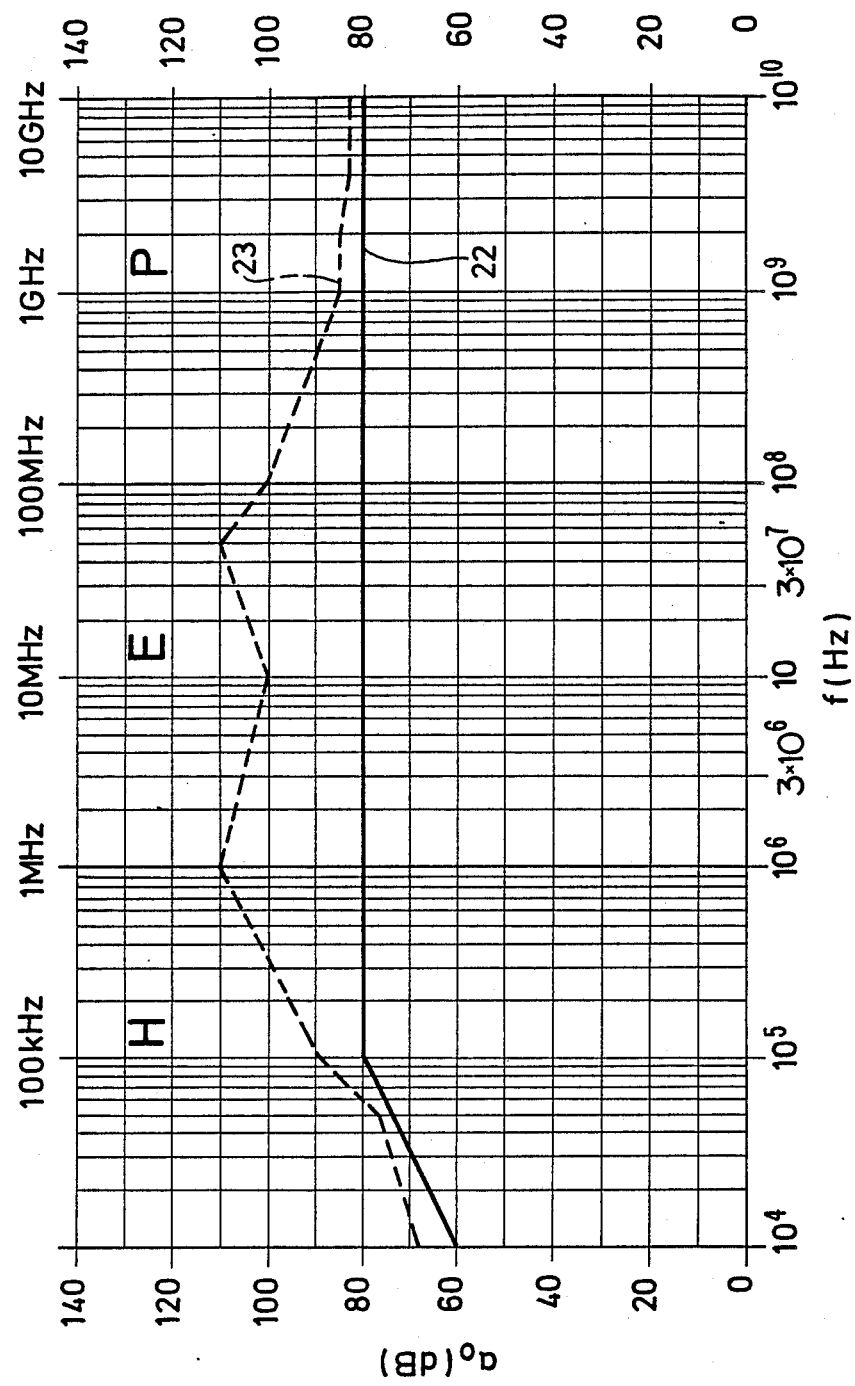
FIG. 3 shows a graphic representation of the obtained shield attenuation values.

For contact briding of the abutting area between the wall 2 and the door 5 a sealing system is disposed around the entire circumference of the door 5, which is represented in FIG. 2 in more detail. The sealing system 8 has a first sealing section 5a disposed on the door 5 and a second sealing section 9a disposed on door frame 9, which overlap each other. The first sealing section 5a contains a continuous groove 10 with a wedge cross-section whose flank surfaces 10a, 10b diverge outwardly. One of the flange surfaces 10a is disposed at least partly on a limiting web 11a, which limits a recess 12a with its opposite side, into which one of the customary elastic sealing strips 12 is inserted. The other flank surface 10b of the groove 10 is also disposed least partly on a limiting web 11b, which limits with its other side a groove 13 for a tread protection 14 not represented in more detail. Undercuts 15 or 16 are provided at a distance from the upper edge at the rear sides of the limiting webs 11a, 11b not facing the groove 10, which may be formed as individual recesses or as grooves. Projections 17 or 18 of contact springs 19 or 20 engage in the undercuts 15 or 16. Each of the contact spring 19 or 20 is designed in strip-like fashion and is possibly slotted. The contact springs 19 or 20 are bent in such fashion that they have in each case a fastening end 19a or 20a which engages resiliently over the limiting webs 11a, 11b, the projection 17 locking in the recess 15 and the projection 18 locking in the recess 16. The contact springs 19, 20 extend with the free ends into the groove 10 and do not reach completely up to the groove bottom. Near the groove bottom a flat area 19b or 20b is provided in each case which have a contact surfaces for the respectively abutting flank surface 10, 10b. A bent area 19c or 20c is provided in each case between the flat area 19b, 20b and the fastening end 19a, 20a, with which the contact springs 1 and 20 reach into the interior of the groove 10.

The sealing section 9a at the door frame 9 has a contact web 21 which projects from the door frame 9 in the direction to the sealing section 5a. The contact web 21 is narrower than the groove 10 and has a wedge-shaped cross-section with converging flank surfaces 21a, 21b which enclose together the same angle as the flank surfaces 10a, 10b of the groove 10. An aperture angel of 25° to 35° proves to be advantageous. Due to this the self-inhibition of the contact web in the contact springs is avoided and the door can be opened without using force. The contact web 21 is dimensioned and disposed in such fashion that it projects between the contact springs 19 or 20 with the door 5 being closed, contact surfaces being formed between the flank surfaces 21a, 21b and the bent areas 19c, 20c. The contact springs are pushed aside. In the ideal case the contact web 21 touches the contact springs 19 or 20 with its front to central area and its central line coincides with the central line of the groove 10. However, due to the selected form of the cross-section of the contact web 21 both work tolerances and assembly tolerances can be compensated in limits.

The sealing sections 5a and 9a consist of aluminum whose surface was coated with tin by the customary flame-spraying process. In order to improve the adhesion between the tin coating and the aluminum, zinc was used as adhesion promoter. Prior to the coating, the surfaces to be coated were blasted with corundum. A good adhesion of the coating on the flank surfaces 21a, 21b of the contact web 21 and the flank surfaces 10a, 10b of the groove 10, in particular with the respectively bent areas 19c, 20c or flat areas 19b, 20c of the contact springs 19, 20 in contact surfaces being in contact should be observed. The areas on surfaces 10a, 10b and 21a, 21b to be coated with tin are schematically illustrated by the thick lines in FIG. 2. The layer thickness is 100 μm for zinc and 100–200 μm for tin. The contact springs 19, 20 are of beryllium copper and also provided with a tin coating. The layer thickness is approx. 20 μm.

If the door 5 of the cabin 1 is closed, the sealing section 5a of the door moves in direction towards the sealing section 9a of the door frame until the sealing 12 stops (and the lock 7 possibly snaps). During this movement the contact web 21 is caused to be pushed between the two contact springs 19 and 20, the distance between the contact springs 19 and 20 being dimensioned in such fashion that the same are pressed apart, the curvature of the belt areas 29c, 20c becoming smaller. The flank surfaces 21a or 21b rub on the surface of the bent areas 19c or 20c. Due to the flattening of the curvature of the bent areas 19c and 20c, the plane area 19b or 20b moves downwardly and rubs on the abutting flank surface 10a to 10b of the groove. If the door 5 is opened again, relative movements between the flank surfaces 21a, 21b and the abutting surfaces of the bent areas 19c, 20c on the one hand the surfaces of the plane areas 19b, 20b facing each other and the flank surfaces 10, 10b of the groove on the other hand occur again. In this fashion the contact surfaces kan be kept clean and adapted to each other in form-fit fashion within certain limits.

The determined shield attentuation values $a_o$ in dB in the frequency range f from 10 kHz to 10 GHz for high-frequency waves with plane wave front (P), magnetic (H) and electric (E) fields at the cabin according to the invention are graphically represented in FIG. 2. These values are measured according to the MIL STD-285, stipulated e.g. in the NATO regulation 6516/SHCPE/87 "Allied Command Europe, Standard Shelter Technical Specifications". The measured cabin contained a tin-plated contact web of aluminum and tin-plated contact springs of beryllium copper. The continuous line 22 in the graphic representation shows the values required according to the aforementioned standard 6516/SHCPE/87 and the dotted line 23 shows the shield attenuation course at the entrance door. It is apparent that the shield attentuation values at the entrance door are far above the required values (and reach almost the values of the continuous side wall). These values are also observed in the case of a long-term strain which is shown by the following long-term and corrosion tests in view of corrosive strains or mechanical abrasion:

LONG-TERM TESTS

Tests were carried out at original samples of the shielding system to prove the operational reliability over the full service life (approx. 10 years) without cleaning and other maintenance works.

CORROSION TEST

The samples were subjected to a salt spraying test according to DIN 50021 in contacted condition. Duration 250 hours. The transfer resistance before and after the test was measured.

| Results | |
| --- | --- |
| Unloaded contacting | 290 μm ohm |

| Results -continued | |
| --- | --- |
| After 250 hours salt spraying test | 500 μm ohm |
| Corrosion test combined with wear test | |
| After 4000 actuations unloaded | 270 μm ohm |
| After 4000 actuations and 250 hours salt spraying test | 530 μm ohm |
| After 8000 actuations unloaded | 300 μm ohm |
| After 8000 actuations and 250 hours salt spraying test | 2.3 m ohm |

After 8000 to 10,000 contact actuations—this corresponds to about 10 years for a cabin—the wear at the tin layer of the contact spring has a resistance increasing effect. After approximately 13,000 load switching processes the spring should be exchanged to observe the high shield attenutation values. The measured low transfer resistances in the μ and milliohm range conform the excellent suitability of the described process.

As a modification of the described and drawn example of embodiment the contact web may e.g. also be disposed on the door and the groove may be disposed on the door frame. It is furthermore not imperative to tin-plate the contact springs if there is only a low environmental load and the requirements regarding its being maintenance free, service life and shield attenuation are reduced. A tin-plating may also be suitable if one or both sealing sections consists of materials other than aluminum. Besides tin, other metals with a melting point higher than that of zinc are also used as adhesion promoters. The coating may moreover also be applied with an arc process.

We claim:

1. An electromagnetically shielded cabin with a sealing system for an abutting area between a stationary component and a movable wall component such as a door, a flap, a hatch or a window, said sealing system comprising two spaced, bent contact springs being connected to the one component between which a contact web connected to the other component can be pressed, contact surfaces being in each case formed between the contact web and the contact springs and the contact springs and the one component, at least one of said contact surfaces is comprised of aluminum and in particular, said contact surfaces comprised of aluminum are provided with a coating of tin.

2. A cabin according to claim 1, characterized in that a metal with a melting temperature higher than that of tin is provided as a coupling agent between said aluminum surface and the tin.

3. A cabin according to one of the claims 1 to 3, characterized in that the contact springs also have a coating of tin.

4. A cabin according to one of the claims 1 to 3, characterized in that the contact springs also have a coating of tin.

5. A cabin according to claim 1, characterized in that the coating is applied by means of flame-spraying.

6. A cabin according to claim 1, characterized in that the contact web has a wedge-shaped cross-section tapered in the direction towards the contact springs.

7. A cabin according to claim 1, characterized in that the contact springs are disposed in a groove which has a wedge-shaped cross-section corresponding to the contact web.

8. A cabin according to claim 6 or 7, characterized in that the wedge-shaped cross-section has an angle of aperture of 25° to 35°.

9. A cabin according to claim 7, characterized in that opposite limiting walls of the groove have undercuts into which projections disposed at the contact springs can be locked.

* * * * *

UNITED STATES PATENT AND TRADEMARK OFFICE
CERTIFICATE OF CORRECTION

PATENT NO. : 4,929,802
DATED : May 29, 1990
INVENTOR(S) : SCHAEPERS et al.

It is certified that error appears in the above-indentified patent and that said Letters Patent is hereby corrected as shown below:

Col. 1, Line 28: delete "DE-A 26" and substitute therefor --DE-A-26--;

Col. 2, Line 55: delete "918" and substitute therefor --928--;

Col. 3, Line 14: delete "according to";

Col. 4, Line 4: delete "briding" and substitute therefor --bridging--;

Col. 5, Line 27: add --and-- after "the one hand";

Col. 6, Line 48: delete "Claims 1 to 3" and substitute therefor --claim 2--;

Col. 6, Lines 49-50: delete "the contact springs also have a coating of tin." and substitute therefor --zinc is provided as said coupling agent.--.

Signed and Sealed this

Tenth Day of May, 1994

Attest:

BRUCE LEHMAN

Attesting Officer  Commissioner of Patents and Trademarks